United States Patent
Hung et al.

(10) Patent No.: US 8,810,324 B2
(45) Date of Patent: Aug. 19, 2014

(54) OSCILLATING DEVICE

(71) Applicant: Sitronix Technology Corp., Hsinchu County (TW)

(72) Inventors: Chih-Te Hung, Hsinchu County (TW); Cheng-Chung Yeh, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 36 days.

(21) Appl. No.: 13/664,679

(22) Filed: Oct. 31, 2012

(65) Prior Publication Data
US 2013/0113574 A1 May 9, 2013

(30) Foreign Application Priority Data

Nov. 4, 2011 (TW) .............................. 100140259 A

(51) Int. Cl.
*H03K 3/03* (2006.01)
*H03L 1/00* (2006.01)
*H03B 5/24* (2006.01)
*H03K 3/023* (2006.01)
*H03K 3/011* (2006.01)

(52) U.S. Cl.
CPC ................ *H03B 5/24* (2013.01); *H03K 3/0322* (2013.01); *H03K 3/023* (2013.01); *H03K 3/011* (2013.01)
USPC .............. 331/57; 331/176; 331/185; 327/535

(58) Field of Classification Search
USPC ............ 327/530, 535, 537–541, 548; 331/57, 331/175, 176, 185, 186
See application file for complete search history.

(56) References Cited

U.S. PATENT DOCUMENTS

| | | | |
|---|---|---|---|
| 5,440,277 A * | 8/1995 | Ewen et al. .................... | 331/176 |
| 5,495,207 A * | 2/1996 | Novof .............................. | 331/57 |
| 6,825,731 B2 * | 11/2004 | Hasegawa ........................ | 331/57 |
| 7,176,737 B2 * | 2/2007 | Baker et al. .................... | 327/280 |
| 7,295,079 B2 * | 11/2007 | Wu et al. .......................... | 331/57 |
| 7,456,676 B2 * | 11/2008 | Sohn .............................. | 327/333 |
| 7,560,998 B2 * | 7/2009 | Ohta et al. ...................... | 331/57 |
| 7,586,380 B1 * | 9/2009 | Natarajan et al. ............... | 331/57 |
| 7,710,207 B2 * | 5/2010 | Wu ................................. | 331/57 |
| 7,719,370 B2 * | 5/2010 | Takai .............................. | 331/57 |
| 7,816,975 B2 * | 10/2010 | Zhou et al. .................... | 327/538 |
| 8,604,884 B2 * | 12/2013 | Coban et al. .................... | 331/57 |
| 2010/0214032 A1 * | 8/2010 | Hinrichs ........................ | 331/57 |

* cited by examiner

*Primary Examiner* — Levi Gannon
(74) *Attorney, Agent, or Firm* — Rosenberg, Klein & Lee

(57) ABSTRACT

The present invention relates to an oscillating device, which comprises a driving module and an oscillating module. The driving module is used for producing a first driving voltage and a second driving voltage. The oscillating module comprises a first symmetric load circuit, a second symmetric load circuit, and a bias circuit. The first symmetric load circuit and the second symmetric load circuit produce a bias according to the first driving voltage. The bias circuit produces a bias current according to the second driving voltage. The oscillating module produces an oscillating signal according to the first driving voltage and the bias current, where the bias current is proportional to the bias. Thereby, by making the driving signal produced by driving module proportional to the bias of the oscillating module, simple compensation for temperature and process can be performed. Thereby, the frequency can be tuned using a few calibration bits.

8 Claims, 7 Drawing Sheets

OSCILLATING DEVICE

FIELD OF THE INVENTION

The present invention relates generally to an oscillating device, and particularly to an oscillating device having process and temperature compensation.

BACKGROUND OF THE INVENTION

The clock frequency output by an oscillator plays an extremely important role in a digital circuit. Different systems have different requirements for the clock frequency. If a very stable and accurate frequency is required, a quartz oscillator is usually adopted as the reference source for the reference clock. This is because the error in the frequency of a quartz oscillator is extremely small. Besides, the influence of temperature of the oscillating frequency is also very small. Nonetheless, the use of the quartz oscillator increases the overall system cost. If a sufficiently accurate (capable of calibrating to a certain accuracy) oscillator can be implemented in a chip and the drift of the oscillating frequency by temperature is small enough, then the quartz oscillator can be substituted. In addition to reducing the cost of quartz oscillator, a product can be made even smaller because the printed circuit board is shrunk. For high-end products requiring extremely accurate frequency, a quartz oscillator is unavoidable. One the other hand, for low-end products less requiring the quality of the frequency, an accurate built-in oscillator becomes a decent choice.

A general oscillator having temperature and process compensation contains the circuit for compensating temperature and process variations. FIG. 1 shows a circuit diagram of the process and temperature compensation circuit according to the prior art. The circuit will provide the suitable driving voltage $V_{CTRL}$ to the subsequent bias circuit according to the process and temperature drifts. The bias circuit will produces a first driving voltage $V_{BP}$ and a second driving voltage $V_{BN}$ to the oscillating circuit according to the driving voltage $V_{CTRL}$. Thereby, under process and temperature drifts, the oscillating circuit can have the proper biasing point and thus oscillating at a fixed frequency. As for the oscillating circuit, it is implemented by using three or more stages of delay buffer connected in series. FIG. 2 shows a circuit diagram of the delay buffer according to the prior art. The delay buffer according to the prior art comprises a current source 10', a first transistor 20', a first symmetric load 30', a second transistor 40', and a second symmetric load 50'. The current source 10' produces a bias current $I_D$ according to the second control signal $V_{BN}$. The first transistor 20' is coupled to the current source 10' and receives a first signal V+. The first symmetric load 30' is coupled to the first transistor 20' and receives a power supply $V_{DD}$. The second transistor 40' is coupled to the current source 10' and receives a second signal V−. The second symmetric load 50' is coupled to the second transistor 40' and receives power supply $V_{DD}$. The first symmetric load 30' includes a third transistor 32' and a fourth transistor 34', while the second symmetric load 50' includes a fifth transistor 52' and a sixth transistor 54'. The equivalent resistance of the first symmetric load 30' and the second symmetric load 50', namely, the third, fourth, fifth, and sixth transistors 32', 34', 52', 54', is approximated by:

$$R_{EQ} = (V_{DD} - V_{BP})/I_D \quad (1)$$

where the first control signal $V_{BP}$ is equal to the driving voltage $V_{CTRL}$ output by the driving circuit for temperature and process variations. Thereby, the above equation (1) can be rewritten as:

$$R_{EQ} = (V_{DD} - V_{CTRL})/I_D \quad (2)$$

where the bias current $I_D$ is determined by the second control signal $V_{BN}$ produced by the bias circuit according to the driving voltage $V_{CTRL}$. The value of the bias current $I_D$ is approximated by:

$$I_D \cong K'_{54'} \times (W_{54'}/L_{54'}) \times (V_{DD} - |V_{T54'}| - V_{CTRL})^2 \quad (3)$$

In addition, the delay time of the delay buffer is:

$$T_D = R_{EQ} \times C_O = C_O \times (V_{DD} - V_{CTRL})/I_D \quad (4)$$

where $C_O$ is the sum of the parasitic capacitors in the delay buffer. If there are N stages of delay buffers, the oscillating frequency will be:

$$\begin{aligned}
f &= 1/(N \times T_D) \quad (5) \\
&= I_D/[N \times C_O \times (V_{DD} - V_{CTRL})] \\
&= [K'_{54'} \times (W_{54'}/L_{54'}) \times (V_{DD} - |V_{T54'}| - V_{CTRL})^2]/ \\
&\quad [N \times C_O \times (V_{DD} - V_{CTRL})]
\end{aligned}$$

For the oscillating frequency f not to vary with process and temperature drifts, the driving voltage $V_{CTRL}$ must satisfy the following condition:

$$V_{CTRL} = V_{DD} - |VTP| - \frac{1}{2} \frac{f \cdot N \cdot C_O}{K'_{54} \times (W_{54'}/L_{54'})} - \quad (6)$$

$$\frac{1}{2}\sqrt{4 \cdot |VTP| \cdot \frac{f \cdot N \cdot C_O}{K'_{54} \times (W_{54'}/L_{54'})} + \left(\frac{f \cdot N \cdot C_O}{K'_{54} \times (W_{54'}/L_{54'})}\right)^2}$$

The driving circuit in FIG. 1 is designed according to the above driving signal $V_{CTRL}$. The amplitude of the bias current $I_B$ and the temperature coefficient will influence the oscillating frequency. The voltage $V_{C1}$ produced by the transistor $M_{C3}$ depends on the threshold voltage |VTP|. Accordingly, the threshold voltage of the p-type transistor can be deduced. Nonetheless, because the voltage $V_{C1}$ is too low, the voltage $V_{C1}$ should be amplified to the voltage $V_{C2}$ by using the amplifier and the resistors $R_{C2}$, $R_{C1}$. Then the transistor $Q_{C1}$ is used for detecting the temperature. Besides, select a suitable size of the transistor $M_{C4}$ along with the resistor $R_{C3}$ to produce the driving signal $V_{CTRL}$. However, the circuit is complicated and uneasy to control owing to too many variables.

Accordingly, the present invention provides a novel oscillating device, which can produce an accurate oscillating frequency not drifting significantly with temperature drift. The problem described above can thus be solved.

SUMMARY

An objective of the present invention is to provide an oscillating device. By making a bias current produced by a second driving voltage proportional to a bias of an oscillating module, simple compensation for temperature and process can be performed. Thereby, the frequency can be tuned using a few calibration bits.

Another objective of the present invention is to provide an oscillating device. By using a voltage regulating circuit for producing a stable voltage as the power source for a driving module and an oscillating module, the influence of the voltage of the power supply on the oscillating frequency can be reduced.

The oscillating device according to the present invention comprises a driving module and an oscillating module. The driving module is used for producing a first driving voltage and a second driving voltage. The oscillating module is coupled to the driving module, and comprises a first symmetric load circuit, a second symmetric load circuit, and a bias circuit. The first symmetric load circuit and the second symmetric load circuit produce a bias according to the first driving voltage. The bias circuit produces a bias current according to the second driving voltage. The oscillating module produces an oscillating signal according to the first driving voltage and the bias current, where the bias current is proportional to the bias. Thereby, by making the driving signal produced by driving module proportional to the bias of the oscillating module, simple compensation for temperature and process can be performed. Thereby, the frequency can be tuned using a few calibration bits.

Moreover, the present invention further comprises a voltage regulating circuit. The voltage regulating circuit receives a power supply and produces a voltage regulating signal, which is transmitted to the driving module and the oscillating module as their power supply. Accordingly, by using the voltage regulating circuit for producing a stable voltage as the power source for the driving module and the oscillating module, the influence of the voltage of the power supply on the oscillating frequency can be reduced.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
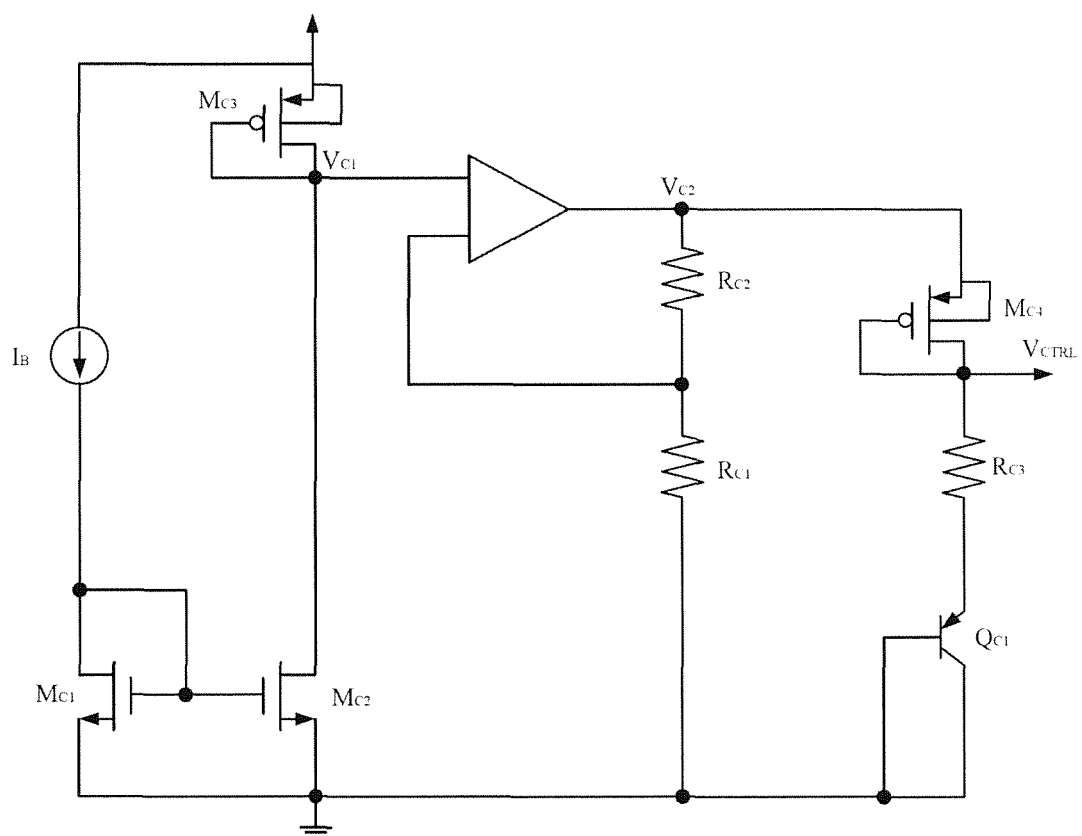
FIG. 1 shows a circuit diagram of process and temperature compensation circuit according to the prior art.
Figure 2:
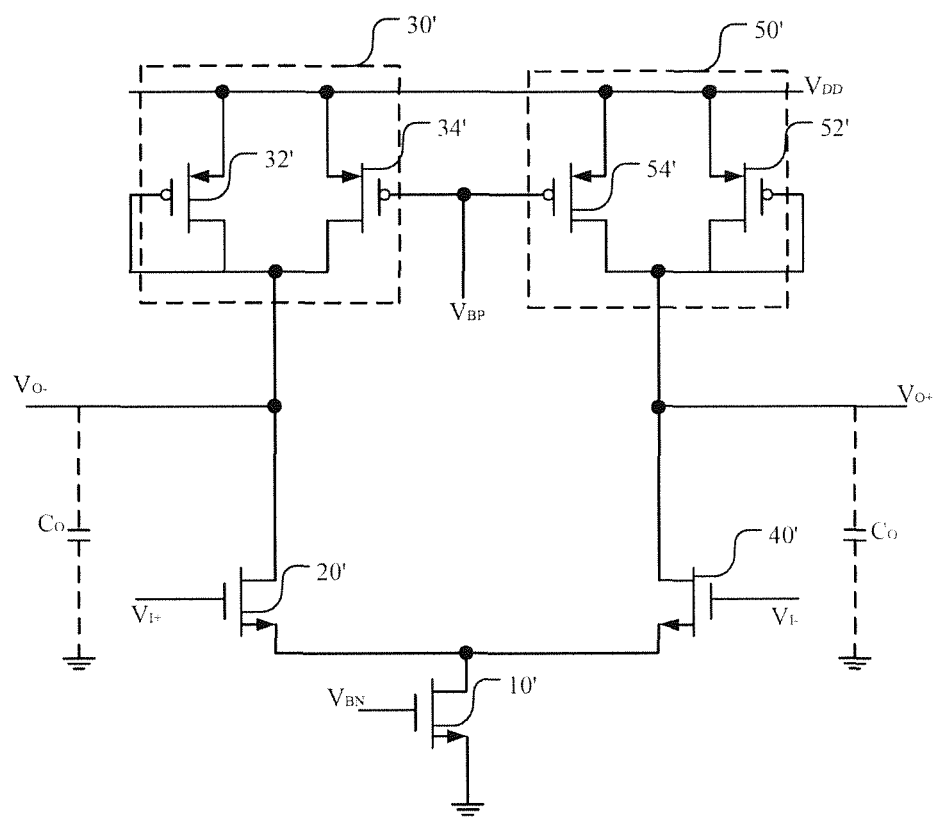
FIG. 2 shows a circuit diagram of the delay buffer according to the prior art.
Figure 3:
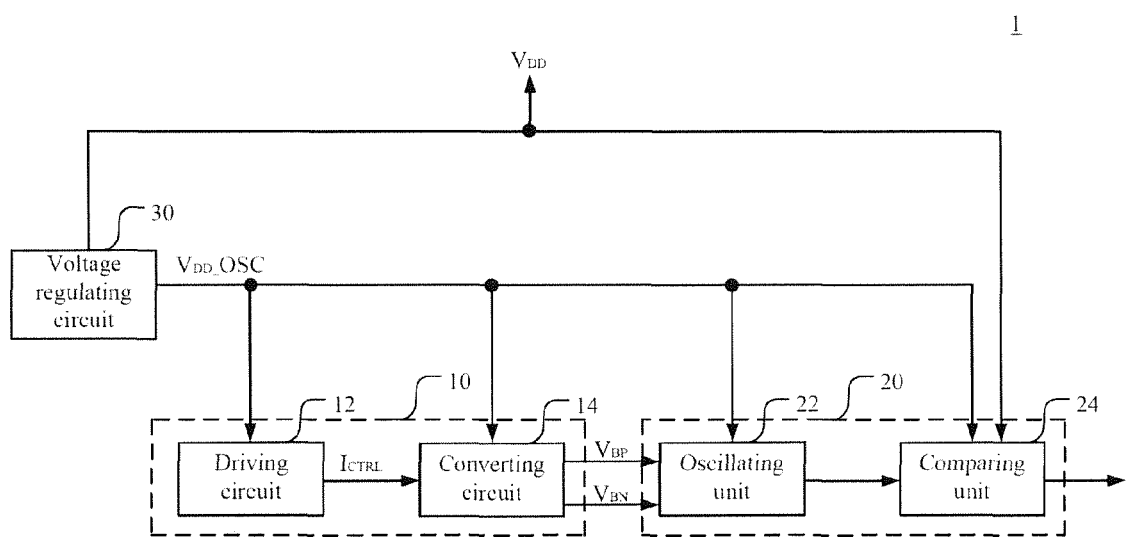
FIG. 3 shows a block diagram of the oscillating device according an embodiment of the present invention.
Figure 4:
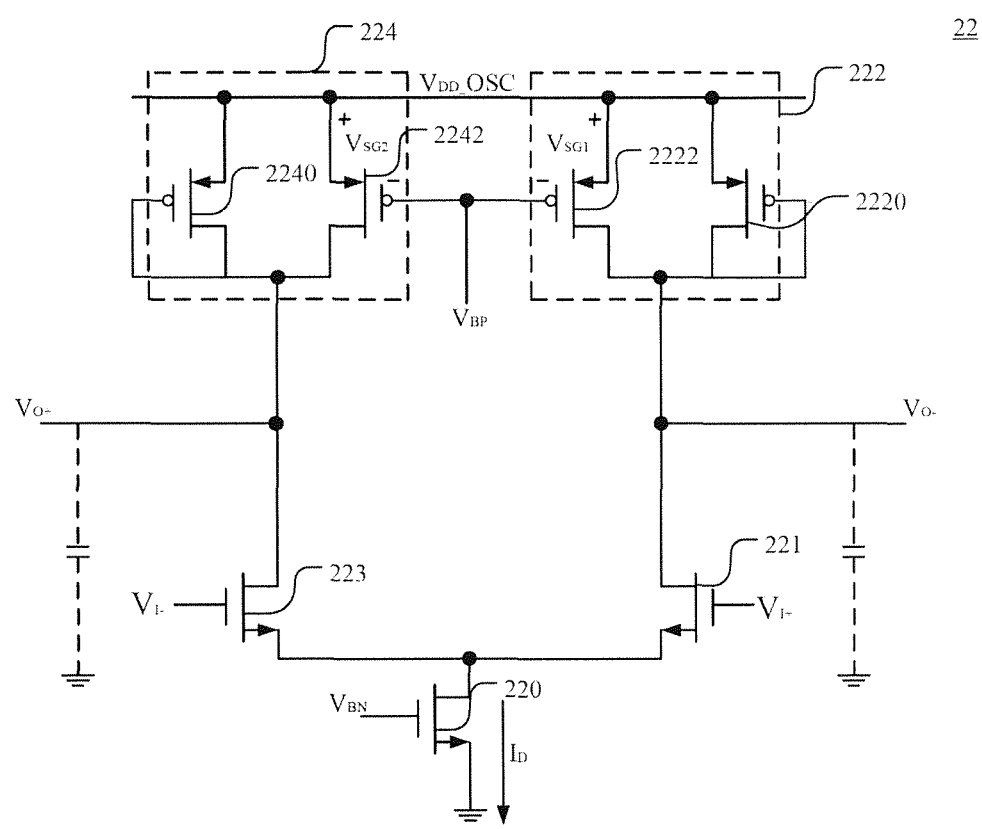
FIG. 4 shows a circuit diagram of the oscillating device according an embodiment of the present invention.

FIG. 3 shows a block diagram of the oscillating device according an embodiment of the present invention. As shown in the figure, the oscillating device 1 according to the present invention comprises a driving module 10 and an oscillating module 20. The driving module 10 is used for producing a first driving voltage $V_{BP}$ and a second driving voltage $V_{BN}$. The oscillating module 20 is coupled to the driving module 10 and has a first symmetric load circuit 222, a second symmetric load circuit 224, and a bias circuit 220, as shown in FIG. 4. The first symmetric load circuit 222 produces a first bias $V_{SG1}$ according to the first driving voltage $V_{BP}$; the second symmetric load circuit 224 produces a first bias $V_{SG2}$ according to the second driving voltage $V_{BN}$. The bias circuit 220 produces a bias current $I_D$ according to the second driving voltage $V_{BN}$. The oscillating module 20 produces an oscillating signal according to the first driving voltage $V_{BP}$ and the bias current $I_D$, where the bias current $I_D$ is proportional to the first bias $V_{SG1}$. In addition, the bias current $I_D$ can also be proportional to the second bias $V_{SG2}$. Thereby, according to the present invention, the second driving voltage $V_{BN}$ of the driving module 10 control the bias current $I_D$ produced by the bias circuit 220 to be proportional to the first bias $V_{SG1}$ for compensating temperature and process drifts; the oscillating signal produced by the oscillating module 20 is hence free from the influence of temperature and process. Accordingly, the present invention can use a few calibration bits for tuning the frequency; the circuit is simplified, and thus the cost is reduced.

The driving module 10 according to the present invention comprises a driving circuit 12 and a converting circuit 14. The driving circuit 12 produces a control current $I_{CTRL}$ according to the first bias $V_{SG1}$ of the first symmetric load circuit 222. The converting circuit 14 is coupled to the driving circuit 12 and converts the control current $I_{CTRL}$ to the first driving voltage $V_{BP}$ and the second driving voltage $V_{BN}$, namely, converting the control current $I_{CTRL}$ to voltage.

Besides, the bias current $I_D$ is produced according to the second driving voltage $V_{BN}$. It is known from the above that the first bias $V_{SG1}$ is proportional to the bias current $I_D$; the bias current $I_D$ depends on the second driving voltage $V_{BN}$; and the second driving voltage $V_{BN}$ depends on the control current $I_{CTRL}$. Thereby, once the control current $I_{CTRL}$ produced by the driving circuit 12 is made proportional to the first bias $V_{SG1}$, the first bias $V_{SG1}$ will be proportional to the bias current $I_D$ and hence compensating for temperature and process drifts. Thus, the oscillating signal produced by the oscillating module 20 will not be influenced by temperature and process, and the adjustment in temperature and process compensation can be reduced. Accordingly, the present invention can use a few calibration bits for tuning the frequency; the circuit is simplified, and thus the cost is reduced.

In addition, the oscillating module 20 according to the present invention comprises an oscillating unit 22 and a comparing unit 24. The oscillating unit 22 receives the first driving voltage $V_{BP}$ and the second driving voltage $V_{BN}$, and produces an oscillating signal, namely, a first output signal Vo+ and a second output signal Vo−. The comparing unit 24 is coupled to the oscillating unit 22. The comparing unit 24 receives the oscillating signal produced by the oscillating unit 22 and converts the oscillating signal to a square-wave signal.

FIG. 4 shows a circuit diagram of the oscillating device according an embodiment of the present invention. As shown in the figure, the oscillating unit 22 according to the present invention comprises at least a buffer circuit, which comprises a bias circuit 220, a first transistor 221, a first symmetric circuit 222, a second transistor 223, and a second symmetric load circuit 224. The bias circuit 220 produces a bias current $I_D$ according to the second bias voltage $V_{BN}$. That is to say, the bias circuit 220 is a transistor. The bias circuit 220 receives the second driving voltage $V_{BN}$ and produces the bias current $I_D$. The first transistor 221 is coupled to the bias circuit 220 and receives a first input signal $V_{I+}$. The first symmetric load circuit 222 is coupled to the first transistor 221. The first symmetric load circuit 222 receives a power supply $V_{DD\_OSC}$ and produces a first bias $V_{SG1}$ according to the power supply $V_{DD\_OSC}$ and the first driving voltage $V_{BP}$. According to the present embodiment, the first symmetric load circuit 222 includes a third transistor 2220 and a fourth transistor 2222. A terminal of the third transistor 2220 is coupled to the gates of the first and the third transistors 221, 2220; the other terminal of the third transistor 2220 is coupled to the power supply $V_{DD\_OSC}$. The gate of the fourth transistor 2222 received the first driving voltage $V_{BP}$. Thereby, the first bias $V_{SG1}$ is produced between the source and the gate of the fourth transistor 2222.

The second transistor 223 is coupled to the bias circuit 220 and receives a second input signal $V_{I-}$. The second symmetric load circuit 224 is coupled to the second transistor 223. The second symmetric load circuit 224 receives the power supply $V_{DD}\_OSC$ and produces the second bias $V_{SG2}$ according to the power supply $V_{DD}\_OSC$ and the first driving voltage $V_{BP}$. The second symmetric load circuit 224 includes a fifth transistor 2240 and a sixth transistor 2242. A terminal of the fifth transistor 2240 is coupled to the gates of the second and the fifth transistors 223, 2240; the other terminal of the fifth transistor 2240 is coupled to the power supply $V_{DD}\_OSC$. A terminal of the sixth transistor 2242 is coupled to the second and the fifth transistors 223, 2240; the other terminal of the sixth transistor 2242 is coupled to the power supply $V_{DD}\_OSC$. Moreover, the gate of the sixth transistor 2242 received the first driving voltage $V_{BP}$. Namely, the second bias $V_{SG2}$ is produced between the source and the gate of the sixth transistor 2242, where the second bias $V_{SG2}$ is equal to the first bias $V_{SG1}$.

Furthermore, the oscillating unit 22 according to the present embodiment is not limited to the circuit structure described above; transistors having the inverse type to the ones described above can be used to form the oscillating unit. That is, the first transistor 221, the second transistor 223, and the transistors used in the bias circuit 220 are all changed to p-type filed-effect transistors, while the third transistor 2220, the fourth transistor 2222, the fifth transistor 2240, and the sixth transistor 2242 are all changed to n-type filed-effect transistors. Thereby, another embodiment of the oscillating unit is formed. This can be easily deduced by a person having ordinary skill in the art. Hence, the details will not be described in detail.

The buffer circuit of the oscillating unit 22 used in the present invention is a differential delay buffer with symmetric load ring oscillator. In addition, the oscillating unit 22 according to the present embodiment can connect a plurality of differential delay buffer with symmetric load ring oscillators in series. In other words, the differential output ($V_{O-}$ and $V_{O+}$ shown in FIG. 4) of each stage of the buffer circuit is connected to the differential input ($V_{I-}$ and $V_{I+}$ shown in FIG. 4) of the buffer circuit of the next stage. The differential output of the buffer circuit of the final stage is connected to the differential input of the buffer circuit of the first stage for forming the ring oscillator. The oscillating frequency is:

$$f = 1/(N \times T_D) \quad (7)$$
$$= I_D / [N \times C_O \times (V_{DD}\_OSC - V_{SG1})] $$
$$= [1/(N \times C_O)] \times [I_D/(V_{DD}\_OSC - V_{SG1})] \quad (8)$$
$$= [1/(N \times C_O)] \times [I_D/V_{SG1}] \quad (9)$$

where $1/(N \times C_O)$ is a constant, and the oscillating frequency f is proportional to $I_D/V_{SG1}$. Thereby, if the bias current $I_D$ is made to be proportional to the first bias $V_{SG1}$, the compensation for temperature and process drifts can be achieved. As shown in FIG. 3, according to the present embodiment, the control current $I_{CTRL}$, which is produced by the driving circuit 12 of the driving module 10 for process and temperature compensation, is made to be proportional to the first bias $V_{SG1}$. Then the converting circuit 14 converts the control current $I_{CTRL}$ to a first driving voltage $V_{BP}$ and a second driving voltage $V_{BN}$ and transmits the first driving voltage $V_{BP}$ and the second driving voltage $V_{BN}$ to the oscillating unit 22 of the oscillating module 20 and thus giving a fixed frequency f independent of temperature and process.

Accordingly, once the output current, namely, the control current $I_{CTRL}$, of the driving circuit can be designed to be proportional to the first bias $V_{SG1}$, a fixed frequency f independent of temperature and process can be given. The output current of the driving circuit can be designed as $V_{SG1}/R$, and then the oscillating frequency can be rewritten as:

$$f = [1/(N \times C_O)] \times [I_D/V_{SG1}] \quad (10)$$
$$= [1/(N \times C_O)] \times [(V_{SG1}/R)/V_{SG1}] \quad (11)$$
$$= 1/(N \times C_O \times R) \quad (12)$$

where the oscillating frequency f depends on the resistance R and the parasitic capacitance $C_O$. For getting an extremely accurate oscillating frequency f, the resistance R can be calibrated for tuning the oscillating frequency to the required one. In the following, multiple circuit structures of the driving circuit 12 capable of producing the output current of $V_{SG1}/R$ are provided.

Figure 5:
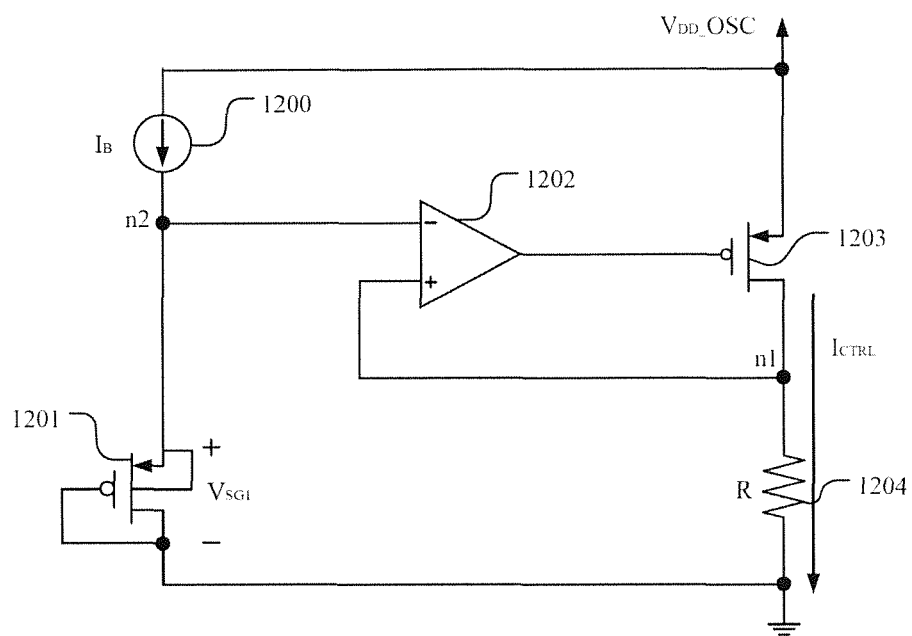
FIG. 5 shows a circuit diagram of the driving circuit according an embodiment of the present invention.

FIG. 5 shows a circuit diagram of the driving circuit according an embodiment of the present invention. As shown in the figure, the driving circuit 12 according to the present invention comprises a current source 1200, a transistor 1201, an error amplifier 1202, an output device 1203, and a resistor 1204. The current source 1200 is used for producing a current $I_B$. The error amplifier 1202 has a first input and a second input. The transistor 1201 is connected in series with the current source 1200. Namely, a terminal of the transistor 1201 is coupled to the current source 1200, while the other terminal of the transistor 1201 is coupled to the ground. The first input of the error amplifier 1201 is coupled to the current source 1200 and the transistor 1201. The output device 1203 is coupled to the error amplifier 1201 and the power supply $V_{DD}\_OSC$. In other words, a terminal of the output device 1203 is coupled to the power supply $V_{DD}\_OSC$, while the other terminal of the output device 1203 is coupled to the second input of the error amplifier 1202. Besides, the gate of the output device 1203 is coupled to the output of the error amplifier 1202 and controlled by the error amplifier 1202. The resistor 1204 is connected in series with the output device 1203 and coupled to the second input of the error amplifier 1202. Namely, a terminal of the resistor 1204 is coupled to the output device 1203 and the error amplifier 1202, while the other terminal of the resistor 1204 is coupled to the ground.

Accordingly, the output device 1203 is used for controlling the voltage of the node n1 between the output device 1203 and the resistor 1204 to be equal to the voltage of the node n2 between the current source 1200 and the transistor 1201. The value of the resistor 1204 determines the amplitude of the control current $I_{CTRL}$. Thereby, by controlling the value of the resistor 1204, the control current $I_{CTRL}$ output by the driving circuit 12 according to the present embodiment will be $V_{SG1}/R$. Hence, simple compensation for temperature and process can be performed and the frequency can be tuned using a few calibration bits.

For general applications, the oscillator can have sufficient accuracy without calibration at various temperatures. Nonetheless, if higher accuracy is required, for example, in the situation replacing the quartz oscillator, calibration on the oscillator is needed. For adjusting the frequency, the resistance of the resistor 1204 can be adjusted for producing the proper control current $I_{CTRL}$ and thus producing the accurate oscillating frequency. A current mirror (not shown in the figure) can also be adopted for adjusting the control current $I_{CTRL}$ transmitted to the converting circuit 14 and thus producing the accurate oscillating frequency. Moreover, for calibrating the temperature coefficient of the oscillating frequency, the amplitude of the current $I_B$ or the area of the transistor 1201 can be tuned to make the temperature coefficient of the oscillating frequency approach zero. Regarding to the resistor 1204, resistors with various temperature coefficients can selected and connected in series to form the resistor 1204 and thus making the temperature coefficient approximately zero. According to the driving method described above, the amplitude and the temperature dependence of the oscillating frequency f can be controlled. Hence, simple compensation for temperature and process can be performed and the frequency can be tuned using a few calibration bits.

Figure 6:
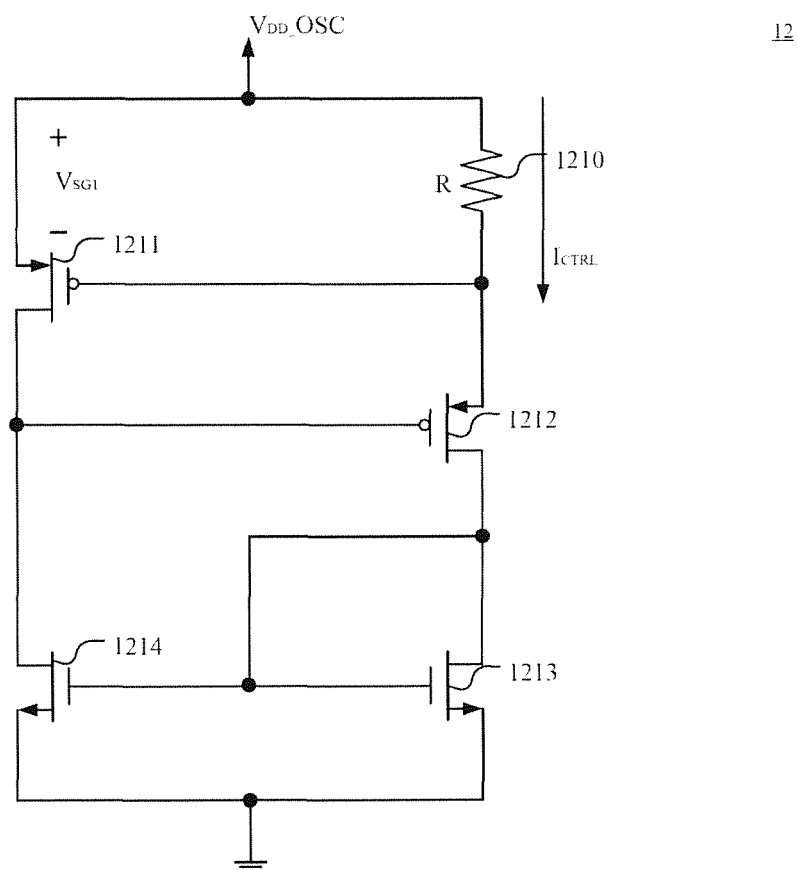
FIG. 6 shows a circuit diagram of the driving circuit according another embodiment of the present invention.

FIG. 6 shows a circuit diagram of the driving circuit according another embodiment of the present invention. As shown in the figure, the driving circuit 12 according to the present embodiment comprises a resistor 1210, a transistor 1211, a transistor 1212, a transistor 1213, and a transistor 1214. A terminal of the resistor 1210 is coupled to the power supply $V_{DD}\_OSC$. A terminal of the transistor 1211 is coupled to the resistor 1210. The gate of the transistor 1211 is coupled to the other terminal of the resistor 1210. A terminal of the transistor 1212 is coupled to the transistor 1211 and the resistor 1210. The gate of the transistor 1212 is coupled to the other terminal of the other transistor 1211. A terminal of the transistor 1213 is coupled to the transistor 1212. The other terminal of the transistor 1213 is coupled to the ground. A terminal of the transistor 1214 is coupled to the transistor 1212. The other terminal of the transistor 1214 is coupled to the ground. The gate of the transistor 1214 is coupled to the gate of the transistor 1213, and the gate of the transistor 1214 is coupled between the transistor 1212 and the transistor 1213. Thereby, by using the transistors 1211, 1212, 1213, 1214, the driving circuit 12 according to the present embodiment can control the control current $I_{CTRL}$ produced by the resistor 1210 to be $V_{SG1}/R$. Namely, the voltage drop $V_{SG}$ between the gate and the source of the transistor 1211 is equal to the oscillating voltage $V_{SG1}$ of the oscillating unit 22, and thus making the control current $I_{CTRL}$ produced by the resistor 1210 be $V_{SG1}/R$. Hence, simple compensation for temperature and process can be performed and the frequency can be tuned using a few calibration bits.

Figure 7:
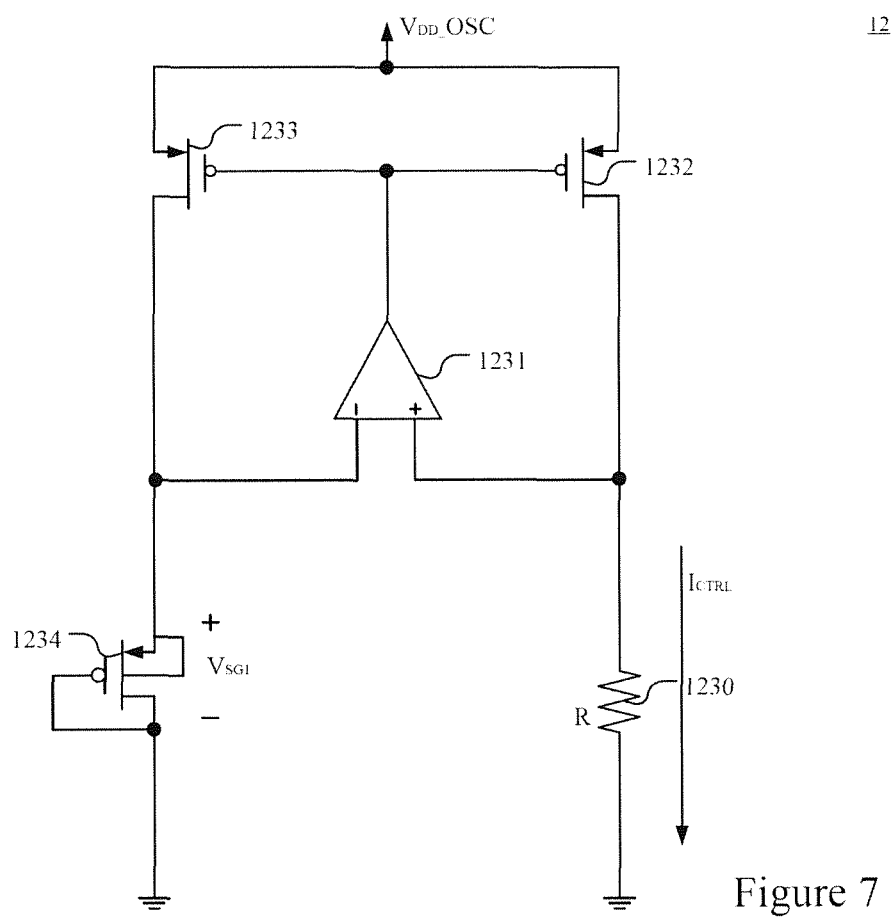
FIG. 7 shows a circuit diagram of the driving circuit according another embodiment of the present invention.

FIG. 7 shows a circuit diagram of the driving circuit according another embodiment of the present invention. As shown in the figure, the driving circuit 12 according to the present invention comprises a resistor 1230, am amplifier 1231, a transistor 1232, a transistor 1233, and a transistor 1234. A terminal of the resistor 1230 is coupled to the ground. The error amplifier 1231 has a first input and a second input. The first input is coupled the other terminal of the resistor 1230. A terminal of the transistor 1232 is coupled to the resistor 1230, while the other terminal of the transistor 1232 is coupled to the power supply $V_{DD}\_OSC$. The gate of the transistor 1232 is coupled to the output of the amplifier 1231. A terminal of the transistor is coupled to the power supply $V_{DD}\_OSC$. The gate of the transistor 1233 is coupled to the output of the error amplifier 1231. A terminal of the transistor 1234 is coupled the second input of the error amplifier 1231 and the transistor 1233. The other terminal of the transistor 1234 is coupled to the gate of the transistor 1234 and the ground. Thereby, by controlling the voltage drop of the transistor 1234 to be the first bias $V_{SG1}$ of the oscillating unit 22, the control current $I_{CTRL}$ produced by the resistor 1230 is made to be $V_{SG1}/R$. Hence, simple compensation for temperature and process can be performed and the frequency can be tuned using a few calibration bits.

Refer again to FIG. 3. The oscillating device according to the present invention further comprises a voltage regulating circuit 30. The voltage regulating circuit 30 is used for receiving a power supply voltage $V_{DD}\_OSC$ for producing and transmitting the voltage regulating signal to the driving module 10 and the oscillating module 20 as their power source. Thereby, by using the voltage regulating circuit 30 for producing a stable voltage as the power source for the driving module 10 and the oscillating module 20, the influence of the voltage of the power supply on the oscillating frequency can be reduced.

To sum up, the oscillating device according to the present invention comprises a driving module and an oscillating module. The driving module is used for producing a first driving voltage and a second driving voltage. The oscillating module is coupled to the driving module, and comprises a first symmetric load circuit, a second symmetric load circuit, and a bias circuit. The first symmetric load circuit and the second symmetric load circuit produce a bias according to the first driving voltage. The bias circuit produces a bias current according to the second driving voltage. The oscillating module produces an oscillating signal according to the first driving voltage and the bias current, where the bias current is proportional to the bias. Thereby, by making the driving signal produced by driving module proportional to the bias of the oscillating module, simple compensation for temperature and process can be performed. Thereby, the frequency can be tuned using a few calibration bits.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An oscillating device, comprising:
   a driving module, used for producing a first driving voltage and a second driving voltage; and
   an oscillating module, coupled to said driving module, having a first symmetric load circuit, a second symmetric load circuit, and a bias circuit, said first symmetric load circuit and said second symmetric load circuit producing a bias according to said first driving voltage, said bias circuit producing a bias current according to said second driving voltage, and said oscillating module producing an oscillating signal according to said first driving voltage and said bias current;
   where said bias current is proportional to said bias, said driving module comprises a driving circuit and a converting circuit, said driving circuit produces a control current according to said bias of said first symmetric load circuit, said converting circuit is coupled to said driving circuit for converting said control current to said first driving voltage and said second driving voltage, and transmitting said first driving voltage and said second driving voltage to said oscillating module.

2. The oscillating device of claim 1, wherein said bias current is proportional to said bias of said first symmetric load circuit.

3. The oscillating device of claim 1, wherein said driving circuit comprises:
   a current source, receiving a power supply for producing a current;

a transistor, connected in series with said current source;

an error amplifier, having a first input and a second input, and said first input coupled to said current source and said transistor;

an output device, coupled to said error amplifier and said power supply, and controlled by said error amplifier; and a resistor, connected in series with said control device, and coupled to said second input of said error amplifier.

4. The oscillating device of claim 1, wherein said driving circuit comprises:

a resistor, having one terminal coupled to a power supply;

a first transistor, having one terminal coupled to said resistor, and the gate of said first transistor coupled to the other terminal of said resistor;

a second transistor, having one terminal coupled to said first transistor and said resistor, and the gate of said second transistor coupled to the other terminal of said first transistor;

a third transistor, having one terminal coupled to said second transistor, and having the other terminal coupled to the ground; and a fourth transistor, having one terminal coupled to said second transistor, having the other terminal coupled to the ground, having the gate coupled to the gate of said third transistor, and having the gate coupled between said second transistor and said fourth transistor.

5. The oscillating device of claim 1, wherein said driving circuit comprises:

a resistor, having one terminal coupled to the ground;

an error amplifier, having a first input and a second input, and said first input coupled to the other terminal of said resistor;

a first transistor, having one terminal coupled to said resistor, having the other terminal coupled to a power supply, and the gate coupled to an output of said error amplifier;

a second transistor, having one terminal coupled to said power supply, having the gate coupled to said output of said error amplifier; and a third transistor, having one terminal coupled to second input of said second transistor, and having the other terminal coupled to the gate of said third transistor and the ground.

6. The oscillating device of claim 1, wherein said oscillating module comprises:

an oscillating unit, receiving said first driving voltage and said second driving voltage, and producing an oscillating signal according to said first driving voltage and said second driving voltage; and a comparing unit, receiving said oscillating signal, and converting said oscillating signal to a square wave.

7. The oscillating device of claim 6, wherein said oscillating unit comprises at least a buffer circuit, and said buffer circuit comprising:

a bias circuit, producing said bias current according to said second driving voltage;

a first transistor, coupled to said bias circuit, and receiving a first input signal;

said first symmetric load circuit, coupled to said first transistor, receiving a power supply, and producing said bias according said power supply;

a second transistor, coupled to said bias circuit, and receiving a second input signal; and said second symmetric load circuit, coupled to said second transistor, receiving said power supply, and producing said bias according to said power supply.

8. The oscillating device of claim 1, and further comprising a voltage regulating circuit, used for receiving a power supply and producing a voltage regulating signal, and transmitting said voltage regulating signal to said driving module and said oscillating module as the power source.

* * * * *